United States Patent
Chan (10) Patent No.: US 10,714,203 B2
(45) Date of Patent: Jul. 14, 2020

(54) SHIFT REGISTER AND DISPLAY APPARATUS

(71) Applicants: HannStar Display (Nanjing) Corporation, Nanjing (CN); HannStar Display Corporation, Taipei (TW)

(72) Inventor: Chien-Ting Chan, Tainan (TW)

(73) Assignees: HannStar Display (Nanjing) Corporation, Nanjing (CN); HannStar Display Corporation, Taipei (TW)

( * ) Notice: Subject to any disclaimer, the term of this patent is extended or adjusted under 35 U.S.C. 154(b) by 181 days.

(21) Appl. No.: 16/109,768

(22) Filed: Aug. 23, 2018

(65) Prior Publication Data
US 2018/0366208 A1 Dec. 20, 2018

Related U.S. Application Data

(63) Continuation of application No. 15/176,151, filed on Jun. 8, 2016, now Pat. No. 10,096,372.

(30) Foreign Application Priority Data

Jun. 11, 2015 (CN) .......................... 2015 1 0319851

(51) Int. Cl.
| | | |
|---|---|---|
| *G11C 19/00* | (2006.01) | |
| *G11C 19/28* | (2006.01) | |
| *G09G 3/3266* | (2016.01) | |
| *G09G 3/36* | (2006.01) | |

(52) U.S. Cl.
CPC ........... *G11C 19/28* (2013.01); *G09G 3/3266* (2013.01); *G09G 3/3677* (2013.01); *G11C 19/287* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | |
|---|---|---|
| 7,664,218 B2 | 2/2010 | Tobita |
| 8,175,215 B2 | 5/2012 | Liu et al. |
| 9,325,127 B2 | 4/2016 | Ku et al. |

(Continued)

FOREIGN PATENT DOCUMENTS

| | | |
|---|---|---|
| CN | 101562046 A | 10/2009 |
| CN | 104050935 A | 9/2014 |

(Continued)

*Primary Examiner* — Tuan T Lam
(74) *Attorney, Agent, or Firm* — CKC & Partners Co., LLC (57) ABSTRACT

A shift register and a display apparatus are provided. The shift register includes a pre-charge unit, a pull-up unit, a first pull-down unit and a second pull-down unit. The pre-charge unit receives first and second input signals, and outputs a pre-charge signal via a first node. The pull-up unit receives a pre-charge signal and a clock signal, and outputs a scanning signal via a second node. The first pull-down unit receives the pre-charge signal, first and second pull-down control signals, and controls whether to pull-down the scanning signal to a reference voltage level. The second pull-down unit receives the pre-charge signal, first and second pull-down control signals, and controls whether to keep the scanning signal at the reference voltage level. The duty cycle of the clock signal is less than 50 percent.

16 Claims, 10 Drawing Sheets

(56) References Cited

U.S. PATENT DOCUMENTS

| | | |
|---|---|---|
| 2007/0217564 A1 | 9/2007 | Tobita |
| 2008/0219401 A1 | 9/2008 | Tobita |
| 2009/0304138 A1 | 12/2009 | Tsai et al. |
| 2012/0008731 A1 | 1/2012 | Hsu et al. |
| 2014/0253424 A1 | 9/2014 | Yu et al. |
| 2015/0102991 A1 | 4/2015 | Yu et al. |
| 2015/0109353 A1 | 4/2015 | Yu et al. |
| 2015/0348484 A1 | 12/2015 | Yu et al. |
| 2016/0140922 A1 | 5/2016 | Dai et al. |
| 2016/0140928 A1 | 5/2016 | Xiao |
| 2016/0215824 A1 | 7/2016 | Gezault et al. |
| 2016/0248402 A1 | 8/2016 | Dai |
| 2016/0248417 A1 | 8/2016 | Xiao |
| 2016/0260403 A1 | 9/2016 | Dai |
| 2017/0018244 A1 | 1/2017 | Jen et al. |
| 2019/0043437 A1* | 2/2019 | Hao .................. G09G 3/3677 |
| 2019/0049768 A1* | 2/2019 | Lv ........................ G09G 3/36 |
| 2019/0070939 A1* | 3/2019 | Blendl ................ B60J 7/0573 |
| 2019/0070978 A1* | 3/2019 | Lohken ................ B60N 2/028 |
| 2019/0108808 A1* | 4/2019 | Lv ..................... G09G 3/3677 |

FOREIGN PATENT DOCUMENTS

| | | |
|---|---|---|
| CN | 104505036 A | 4/2015 |
| CN | 104575409 A | 4/2015 |

\* cited by examiner

SHIFT REGISTER AND DISPLAY APPARATUS

RELATED APPLICATIONS

This application is a continuation of the U.S. application Ser. No. 15/176,151, filed on Jun. 8, 2016, which claims the priority benefit of Chinese Application Serial Number 201510319851.7, filed on Jun. 11, 2015. All disclosures are incorporated herewith by reference.

BACKGROUND

Field of Invention

The invention relates to a shift register, and more particularly to a shift register for improving display quality and a display apparatus having such shift register.

Description of Related Art

A flat panel display device, such as a liquid crystal display (LCD) device or an organic light-emitting diode (OLED) display device, generally has a lot of shift registers for controlling gray levels of all pixels displayed in the display device at the same time point. However, the accuracy of the signals outputted at each time point should be taken into consideration for the electrical circuit design of the shift register, in order to ensure image display quality of the display device. On the other hand, for a high definition (HD) display device, the accuracy of waveforms outputted by the shift register would be as the resistance-capacitance (RC) loading increases. Such condition would lead the pixels in the display panel to receive incorrect data, or arise display issues such as spot mura defects, line mura defects or noise interference of the display apparatus can be solved, resulting in degradation of user experience.

SUMMARY

An objective of the invention is to provide a shift register and a display apparatus for solving display issues such as spot mura defects, line mura defects or noise interference, thereby improving the image display quality.

One aspect of the invention is directed to a shift register which includes a pre-charge unit, a pull-up unit, a first pull-down unit and a second pull-down unit. The pre-charge unit is configured to receive a first input signal and a second input signal and to output a pre-charge signal via a first node based on the first input signal and the second input signal. The pull-up unit is coupled to the pre-charge unit, and is configured to receive the pre-charge signal and a dock signal and to output a scan signal via a second node based on the pre-charge signal and the clock signal. The first pull-down unit is coupled to the pre-charge unit and the pull-up unit, and is configured to receive the pre-charge signal, a first pull-down control signal and a second pull-down control signal and to control whether to pull down the scan signal to a first reference voltage level based on the pre-charge signal, the first pull-down control signal and the second pull-down control signal. The second pull-down unit coupled to the pre-charge unit and the pull-up unit, and is configured to receive the pre-charge signal, the first pull-down control signal and the second pull-down control signal and to control whether to keep the scan signal at the first reference voltage level based on the pre-charge signal, the first pull-down control signal and the second pull-down control signal. The first pull-down control signal and the second pull-down control signal are substantially phase-inverted from each other, and a duty cycle of the clock signal is less than 50 percent.

In one embodiment of the invention, a high level duration of the clock signal is half of a clock period of the clock signal subtracted by a data writing period.

In one embodiment of the invention, the pre-charge unit includes a first transistor and a second transistor. A gate of the first transistor is configured to receive a starting signal, a first source/drain of the first transistor is configured to receive a forward input signal, and a second source/drain of the first transistor is configured to output the pre-charge signal. A gate and a first source/drain of the second transistor are configured to receive a scan signal outputted by a next four stage shift register, and a second source/drain of the second transistor is coupled to the second source/drain of the first transistor.

In one embodiment of the invention, the pre-charge unit includes a first transistor and a second transistor. A gate of the first transistor is configured to receive a scan signal outputted by a previous four stage shift register, a first source/drain of the first transistor is configured to receive a forward input signal, and a second source/drain of the first transistor is configured to output the pre-charge signal. A gate of the second transistor is configured to receive a scan signal outputted by a next four stage shift register, a first source/drain of the second transistor is configured to receive a backward input signal, and a second source/drain of the second transistor is coupled to the second source/drain of the first transistor.

In one embodiment of the invention, the pull-up unit includes a third transistor and a capacitor. A gate of the third transistor is configured to receive the pre-charge signal, a first source/drain of the third transistor is configured to receive the clock signal, and a second source/drain of the third transistor is configured to output the scan signal. A first terminal of the capacitor is coupled to the gate of the third transistor, and a second terminal of the capacitor is coupled to the second source/drain of the third transistor.

In one embodiment of the invention, the first pull-down unit includes a fourth transistor, a fifth transistor, a sixth transistor, a seventh transistor and an eighth transistor. A gate and a first source/drain the fourth transistor are configured to input the first pull-down control signal. A gate of the fifth transistor is configured to input the second pull-down control signal, a first source/drain of the fifth transistor is configured to input the first reference voltage level, and a second source/drain of the fifth transistor is coupled to the second source/drain of the fourth transistor. A gate of the sixth transistor is coupled to the first node, a first source/drain of the sixth transistor is configured to input the first reference voltage level, and a second source/drain of the sixth transistor is coupled to the second source/drain of the fourth transistor. A gate of the seventh transistor is coupled to the second source/drain of the sixth transistor, a first source/drain of the seventh transistor is configured to input the first reference voltage level, and a second source/drain of the seventh transistor is coupled to the first node. A gate of the eighth transistor is coupled to the second source/drain of the sixth transistor, a first source/drain of the eighth transistor is configured to input a second reference voltage level, and a second source/drain of the eighth transistor is coupled to the second node.

In one embodiment of the invention, the second pull-down unit includes a ninth transistor, a tenth transistor, an eleventh transistor, a twelfth transistor and a thirteenth transistor. A gate and a first source/drain of the ninth transistor are configured to input the second pull-down control signal. A gate of the tenth transistor is configured to input the first pull-down control signal, a first source/drain of the tenth transistor is configured to input the first reference voltage level, and a second source/drain of the tenth transistor is coupled to the second source/drain of the ninth transistor. A gate of the eleventh transistor is coupled to the first node, a first source/drain of the eleventh transistor is configured to input the first reference voltage level, and a second source/drain of the eleventh transistor is coupled to the second source/drain of the ninth transistor. A gate of the twelfth transistor is coupled to the second source/drain of the eleventh transistor, a first source/drain of the twelfth transistor is configured to input the first reference voltage level, and a second source/drain of the twelfth transistor is coupled to the first node. A gate of the thirteenth transistor is coupled to the second source/drain of the eleventh transistor, a first source/drain of the thirteenth transistor is configured to input a second reference voltage level, and a second source/drain of the thirteenth transistor is coupled to the second node.

In one embodiment of the invention, the second reference voltage level is substantially lower than the first reference voltage level.

In one embodiment of the invention, a difference between the second reference voltage level and the first reference voltage level is substantially 3 volts.

Another aspect of the invention is directed to a display apparatus which includes a display panel and a gate driver. The gate driver is configured to drive the display panel and has $1^{st}$-$N^{th}$ stage shift registers. The $i^{th}$ stage shift register of the $1^{st}$-$N^{th}$ stage shift registers includes a pre-charge unit, a pull-up unit, a first pull-down unit and a second pull-down unit. The pre-charge unit is configured to receive a first input signal and a second input signal and to output a pre-charge signal via a first node based on the first input signal and the second input signal. The pull-up unit is coupled to the pre-charge unit, and is configured to receive the pre-charge signal and a clock signal and to output an $i^{th}$ stage scan signal via a second node based on the pre-charge signal and the clock signal. The first pull-down unit is coupled to the pre-charge unit and the pull-up unit, and is configured to receive the pre-charge signal, the first pull-down control signal and the second pull-down control signal and to control whether to pull down the $i^{th}$ stage scan signal to a reference voltage level based on the pre-charge signal, the first pull-down control signal and the second pull-down control signal. The second pull-down unit is coupled to the pre-charge unit and the pull-up unit, and is configured to receive the pre-charge signal, the first pull-down control signal and the second pull-down control signal and to control whether to keep the $i^{th}$ stage scan signal at the reference voltage level based on the pre-charge signal, the first pull-down control signal and the second pull-down control signal. The first pull-down control signal and the second pull-down control signal are substantially phase-inverted from each other, and a duty cycle of the clock signal is less than 50 percent.

In one embodiment of the invention, a high level duration of the clock signal is half of a clock period of the clock signal subtracted by a data writing period.

In one embodiment of the invention, the pre-charge unit of the stage shift register includes a first transistor and a second transistor. A gate of the first transistor is configured to receive a first input signal, a first source/drain of the first transistor is configured to receive a forward input signal, and a second source/drain of the first transistor is configured to output the pre-charge signal. A gate and a first source/drain of the second transistor are configured to receive a second input signal, and a second source/drain of the second transistor is coupled to the second source/drain of the first transistor. When i is from 1 to 4, the first input signal is a starting signal, and the second input signal is an $(i+4)^{th}$ stage scan signal outputted by the $(i+4)^{th}$ stage shift register of the $1^{st}$-$N^{th}$ stage shift registers. When i is from (N−3) to N, the first input signal is an $(i-4)^{th}$ stage scan signal outputted by the $(i-4)^{th}$ stage shift register of the $1^{st}$-$N^{th}$ stage shift registers, and the second input signal is an ending signal. When i is from 5 to (N−4), the first input signal is an $(i-4)^{th}$ stage scan signal outputted by the $(i-4)^{th}$ stage shift register of the $1^{st}$-$N^{th}$ stage shift registers, and the second input signal is an $(i+4)^{th}$ stage scan signal outputted by the $(i+4)^{th}$ stage shift register of the $1^{st}$-$N^{th}$ stage shift registers.

In one embodiment of the invention, the pre-charge unit of the $i^{th}$ stage shift register includes a first transistor and a second transistor. A gate of the first transistor is configured to receive a first input signal, a first source/drain of the first transistor is configured to receive a forward input signal, and a second source/drain of the first transistor is configured to output the pre-charge signal. A gate of the second transistor is configured to receive a second input signal, a first source/drain of the second transistor is configured to receive a backward input signal, and a second source/drain of the second transistor is coupled to the second source/drain of the first transistor. When i is from 1 to 4, the first input signal is a starting signal, and the second input signal is an $(i+4)^{th}$ stage scan signal outputted by the $(i+4)^{th}$ stage shift register of the $1^{st}$-$N^{th}$ stage shift registers. When i is from (N−3) to N, the first input signal is an $(i-4)^{th}$ stage scan signal outputted by the $(i-4)^{th}$ stage shift register of the $1^{st}$-$N^{th}$ stage shift registers, and the second input signal is an ending signal. When i is from 5 to (N−4), the first input signal is an $(i-4)^{th}$ stage scan signal outputted by the $(i-4)^{th}$ stage shift register of the $1^{st}$-$N^{th}$ stage shift registers, and the second input signal is an $(i+4)^{th}$ stage scan signal outputted by the $(i+4)^{th}$ stage shift register of the $1^{st}$-$N^{th}$ stage shift registers.

In one embodiment of the invention, the pull-up unit of the $i^{th}$ stage shift register includes a third transistor and a capacitor. A gate of the third transistor is configured to receive the pre-charge signal, a first source/drain of the third transistor is configured to receive the clock signal, and a second source/drain of the third transistor is configured to output the $i^{th}$ stage scan signal. A first terminal of the capacitor is coupled to the gate of the third terminal, and a second terminal of the capacitor is coupled to the second source/drain of the third transistor.

In one embodiment of the invention, the first pull-down unit of the $i^{th}$ stage shift register includes a fourth transistor, a fifth transistor, a sixth transistor, a seventh transistor and an eighth transistor. A gate and a first source/drain the fourth transistor are configured to input the first pull-down control signal. A gate of the fifth transistor is configured to input the second pull-down control signal, a first source/drain of the fifth transistor is configured to input the first reference voltage level, and a second source/drain of the fifth transistor is coupled to the second source/drain of the fourth transistor. A gate of the sixth transistor is coupled to the first node, a first source/drain of the sixth transistor is configured to input the first reference voltage level, and a second source/drain of the sixth transistor is coupled to the second source/drain of the fourth transistor. A gate of the seventh transistor is coupled to the second source/drain of the sixth transistor, a first source/drain of the seventh transistor is configured to input the first reference voltage level, and a second source/ drain of the seventh transistor is coupled to the first node. A gate of the eighth transistor is coupled to the second source/drain of the sixth transistor, a first source/drain of the eighth transistor is configured to input a second reference voltage level, and a second source/drain of the eighth transistor is coupled to the second node. The second reference voltage level is substantially lower than the first reference voltage level.

In one embodiment of the invention, the second pull-down unit of the $i^{th}$ stage shift register includes a ninth transistor, a tenth transistor, an eleventh transistor, a twelfth transistor and a thirteenth transistor. A gate and a first source/drain of the ninth transistor are configured to input the second pull-down control signal. A gate of the tenth transistor is configured to input the first pull-down control signal, a first source/drain of the tenth transistor is configured to input the first reference voltage level, and a second source/drain of the tenth transistor is coupled to the second source/drain of the ninth transistor. A gate of the eleventh transistor is coupled to the first node, a first source/drain of the eleventh transistor is configured to input the first reference voltage level, and a second source/drain of the eleventh transistor is coupled to the second source/drain of the ninth transistor. A gate of the twelfth transistor is coupled to the second source/drain of the eleventh transistor, a first source/drain of the twelfth transistor is configured to input the first reference voltage level, and a second source/drain of the twelfth transistor is coupled to the first node. A gate of the thirteenth transistor is coupled to the second source/drain of the eleventh transistor, a first source/drain of the thirteenth transistor is configured to input a second reference voltage level, and a second source/drain of the thirteenth transistor is coupled to the second node. The second reference voltage level is substantially lower than the first reference voltage level.

In one embodiment of the invention, a difference between the second reference voltage level and the first reference voltage level is substantially 3 volts.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

Figure 1:
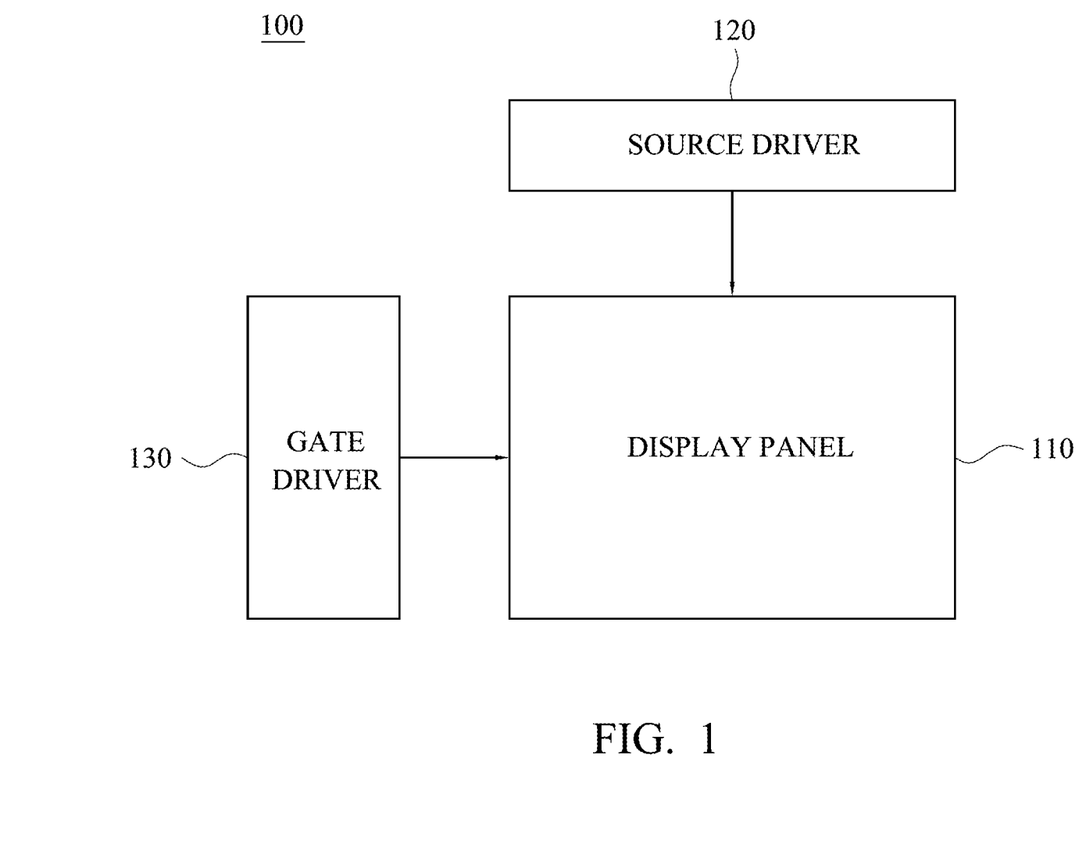
FIG. 1 is a schematic diagram of a display apparatus in accordance with some embodiments of the invention.

Please refer to FIG. 1, which is a schematic diagram of a display apparatus 100 in accordance with some embodiments of the invention. The display apparatus 100 includes a display panel 110, a source driver 120 and a gate driver 130. The display panel 110 includes pixels arranged in a matrix for collectively displaying an image. The display panel 110 may be, for example, a liquid crystal display (LCD) panel of twisted nematic (TN) mode, in-plane switching (IPS) mode, fringe-field switching (FFS) mode, vertical alignment (VA) mode or other different modes, or an organic light-emitting diode (OLED) display panel. The source driver 120 is electrically connected to the display panel 110, and is configured to convert image data into source driving signals and to transmit the source driving signals to the display panel 110. The gate driver 130 is configured to generate gate driving signals and to transmit the gate driving signals to the display panel 110. The display panel 110 displays an image by driving the source driving signals and the gate driving signals.

Figure 2:
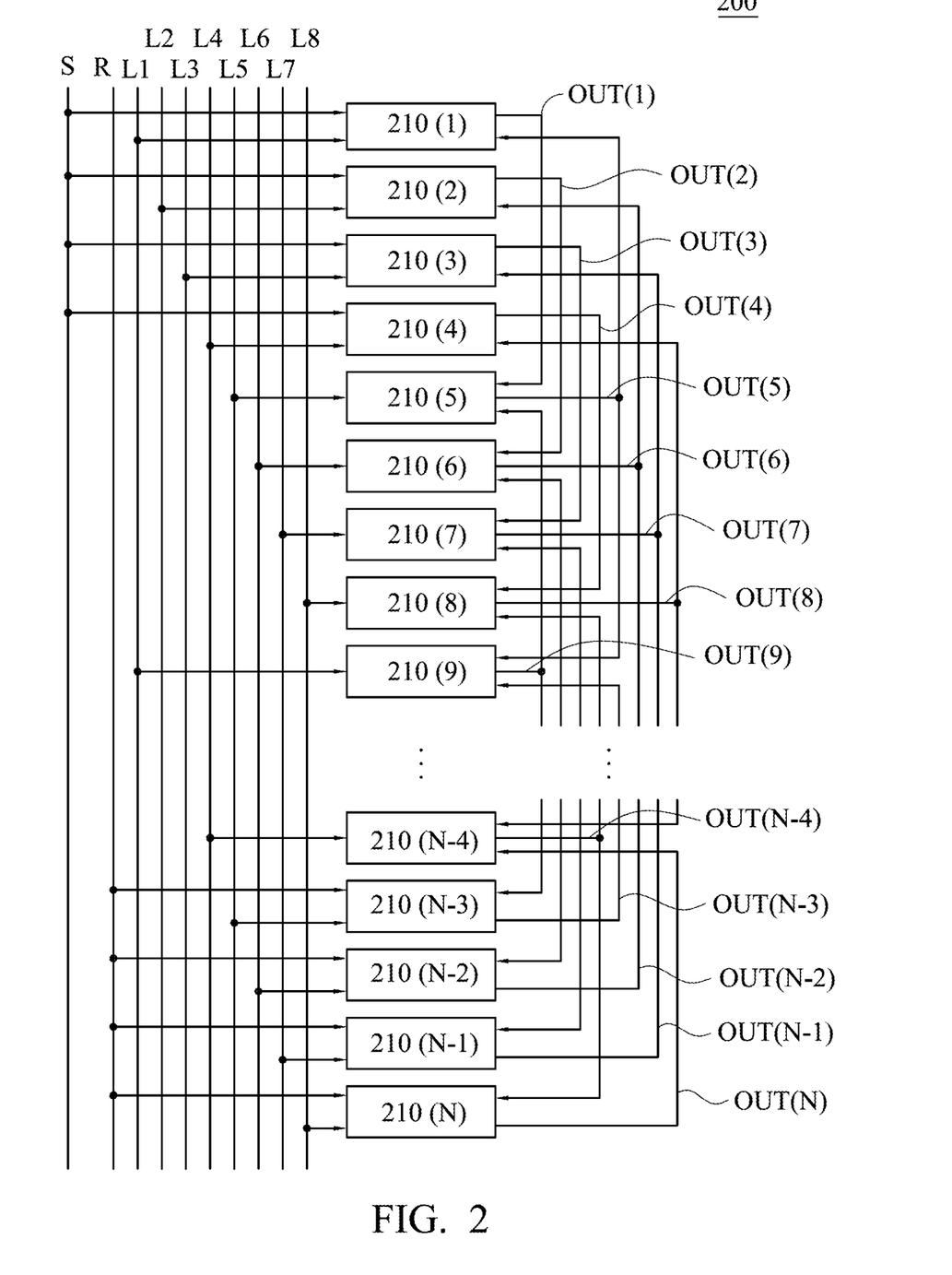
FIG. 2 is a schematic structural diagram of a gate driving circuit in accordance with some embodiments of the invention.

Please refer to FIG. 2, which is a schematic structural diagram of a gate driving circuit 200 in accordance with some embodiments of the invention. The gate driving circuit 200 is applicable to the display apparatus 100 of FIG. 1 or to another similar display apparatus. In the following, the display apparatus 100 of FIG. 1 is exemplified for description. The gate driving circuit 200 is a part of the gate driver 130. The gate driving circuit 200 includes clock signal lines L1-L8, a starting signal line S, an ending signal line R and N stage shift registers 210(1)-210(N), where N is an integer greater than or equal to 9. In some embodiments, N is a multiple of 8. The clock signal lines L1-L8 are respectively configured to provide clock signals C1-C8 for the corresponding shift registers 210(1)-210(N). In some embodiments, the duty cycle of the clock signals C1-C8 (i.e. the ratio of the duration of high voltage to the full duration in one period of the clock signals C1-C8) is less than 50 percent. In FIG. 2, the clock signal lines L1-L8 respectively provide the clock signals C1-C8 to the corresponding shift registers 210(1)-210(N). In addition, the starting signal line S provides a starting signal STV to the $1^{st}$-$4^{th}$ stage shift registers 210(1)-210(4), and the ending signal line R provides an ending signal RSTV to the $(N-3)^{th}$-$N^{th}$ stage shift registers 210(N-3)-210(N). The shift registers 210(1)-210(N) respectively generate scan signals OUT(1)-OUT(N). The scan signals OUT(1)-OUT(4) are respectively inputted to the $5^{th}$-$8^{th}$ stage shift registers 210(5)-210(8), the scan signals OUT(N-3)-OUT(N) are respectively inputted to the $(N-7)^{th}$-$(N-4)^{th}$ stage shift registers 210(N-7)-210(N-4), and each of the scan signals OUT(5)-OUT(N-4) is inputted to the shift registers previous four stage shift register thereto and next four stage shift register thereto. For illustration, the scan signal OUT(5) is inputted to the $1^{st}$ stage shift register 210(1) and the $9^{th}$ stage shift register 210(9).

Figure 3:
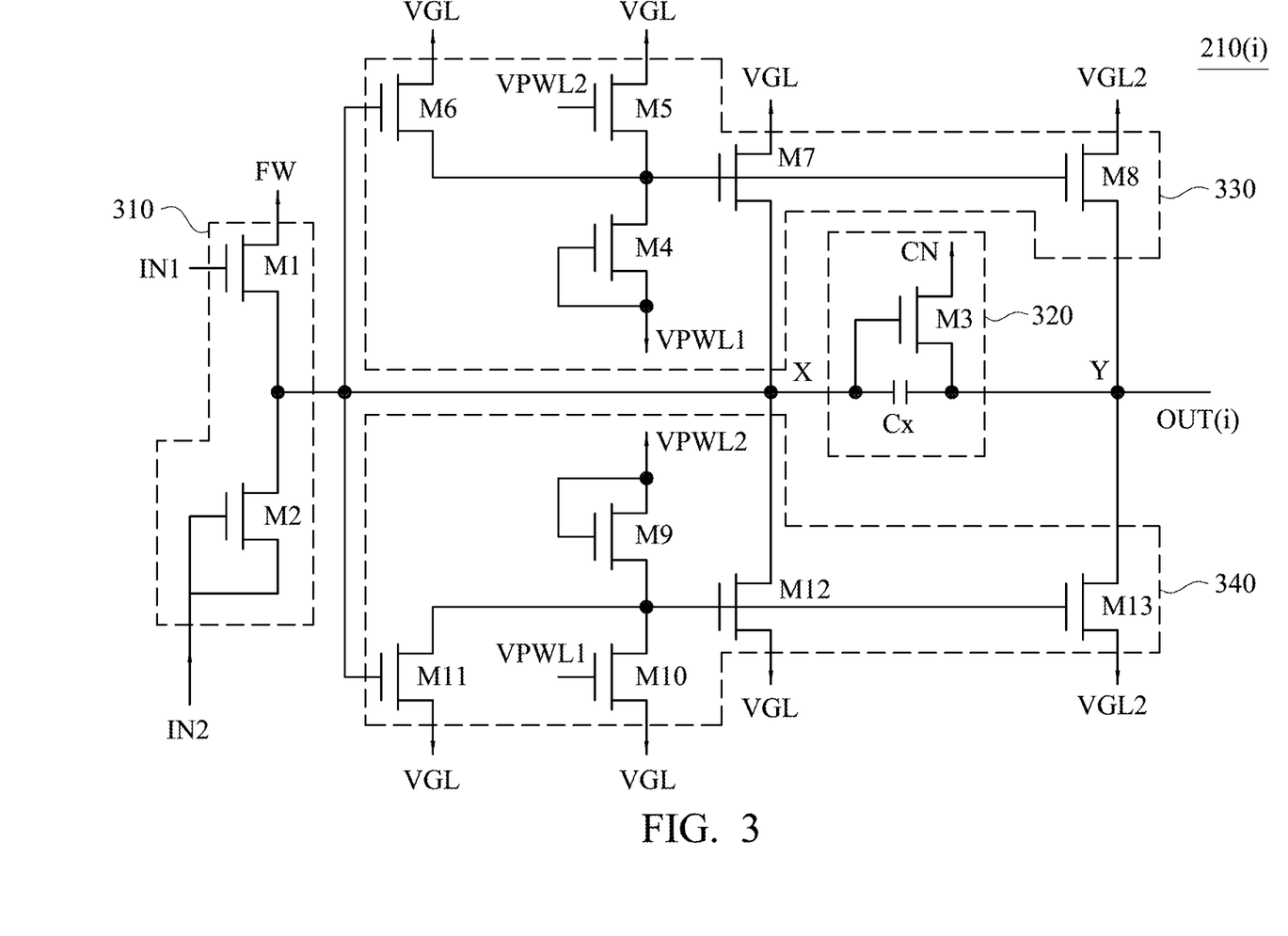
FIG. 3 is an equivalent circuit diagram of a shift register of the gate driving circuit in FIG. 2.

FIG. 3 is an equivalent circuit diagram of the $i^{th}$ stage shift register 210($i$) of the gate driving circuit 200 in FIG. 2, where i is an integer from 1 to N. The $i^{th}$ stage shift register 210($i$) includes a pre-charge unit 310, a pull-up unit 320, a first pull-down unit 330 and a second pull-down unit 340.

The pre-charge unit 310 is configured to receive input signals IN1 and IN2 and to output a pre-charge signal via a node X based on the input signals IN1 and IN2. The pre-charge unit 310 includes transistors M1 and M2. In this embodiment, the gate driving circuit 200 performs one-way scanning, and in each of the shift registers 210(1)-210(N), the gate of the transistor M1 is configured to receive the input signal IN1, the first source/drain of the transistor M1 is configured to receive a forward input signal FW, and the second source/drain of the transistor M1 is configured to output the pre-charge signal. The gate and the first source/drain of the transistor M2 are configured to receive the input signal IN2, and the second source/drain of the transistor M2 is coupled to the second source/drain of the transistor M1.

If the shift register 210(i) is one of the $1^{st}$-$4^{th}$ stage shift registers 210(1)-210(4) (i.e. i is an integer from 1 to 4), the input signal IN1 is the starting signal STV, and the input signal IN2 is the scan signal OUT(i+4) outputted by the $(i+4)^{th}$ stage shift register 210(i+4). If the shift register 210(i) is one of the $5^{th}$-$(N-4)^{th}$ stage shift register 210(5)-210(N-4) (i.e. i is an integer from 5 to (N-4)), the input signal IN1 is the scan signal OUT(i-4) outputted by the $(i-4)^{th}$ stage shift register 210(i-4), and the input signal IN2 is the scan signal OUT(i+4) outputted by the $(i+4)^{th}$ stage shift register 210(i+4). If the shift register 210(i) is one of the $(N-3)^{th}$-$N^{th}$ stage shift registers 210(N-3)-210(N) (i.e. i is an integer from (N-3) to N), the input signal IN1 is the scan signal OUT(i-4) outputted by the $(i-4)^{th}$ stage shift register 210(i-4), and the input signal IN2 is the ending signal RSTV.

The pull-up unit 320 is coupled to the pre-charge unit 310, and is configured to receive the pre-charge signal and a clock signal CN and to output the scan signal OUT(i) via a node Y based on the pre-charge signal and the clock signal CN, in which the clock signal CN is one of the clock signals C1-C8. The pull-up unit 320 includes a transistor M3 and a capacitor Cx. The gate of the transistor M3 is configured to receive the pre-charge signal, the first source/drain of the transistor M3 is configured to receive the clock signal CN, and the second source/drain of the transistor M3 is configured to output the scan signal OUT(i). The first terminal of the capacitor Cx is coupled to the gate of the transistor M3, and the second terminal of the capacitor Cx is coupled to the second source/drain of the transistor M3.

The first pull-down unit 330 is coupled to the pre-charge unit 310 and the pull-up unit 320. The first pull-down unit 330 is configured to receive the pre-charge signal and pull-down control signals VPWL1 and VPWL2 and to control whether to pull down the scan signal OUT(i) to a reference voltage level VGL based on the pre-charge signal and the pull-down control signals VPWL1 and VPWL2. The first pull-down unit 330 includes transistors M4-M8. The gate and the first source/drain of the transistor M4 are configured to input the pull-down control signal VPWL1. The gate of the transistor M5 is configured to input the pull-down control signal VPWL2, the first source/drain of the transistor M5 is coupled to input the reference voltage level VGL, and the second source/drain of the transistor M5 is coupled to the second source/drain of the transistor M4. The gate of the transistor M6 is coupled to the node X, the first source/drain of the transistor M6 is configured to input the reference voltage level VGL, and the second source/drain of the transistor M6 is coupled to the second source/drain of the transistor M4. The gate of the transistor M7 is coupled to the second source/drain of the transistor M6, the first source/drain of the transistor M7 is configured to input the reference voltage level VGL, and the second source/drain of the transistor M7 is coupled to the node X. The gate of the transistor M8 is coupled to the second source/drain of the transistor M6, the first source/drain of the transistor M8 is configured to input a reference voltage level VGL2, and the second source/drain of the transistor M8 is coupled to the node Y. The reference voltage levels VGL and VGL2 may be the same, or alternatively, the reference voltage level VGL2 may be lower than the reference voltage level VGL.

The second pull-down unit 340 is coupled to the pre-charge unit 310 and the pull-up unit 320. The second pull-down unit 340 is configured to receive the pre-charge signal and the pull-down control signals VPWL1 and VPWL2 and to control whether to keep the scan signal OUT(i) at the reference voltage level VGL based on the pre-charge signal and the pull-down control signals VPWL1 and VPWL2. The second pull-down unit 340 includes transistors M9-M13. The gate and the first source/drain of the transistor M9 are configured to input the pull-down control signal VPWL2. The gate of the transistor M10 is configured to input the pull-down control signal VPWL1, the first source/drain of the transistor M10 is coupled to input the reference voltage level VGL, and the second source/drain of the transistor M10 is coupled to the second source/drain of the transistor M9. The gate of the transistor M11 is coupled to the node X, the first source/drain of the transistor M11 is configured to input the reference voltage level VGL, and the second source/drain of the transistor M11 is coupled to the second source/drain of the transistor M9. The gate of the transistor M12 is coupled to the second source/drain of the transistor M11, the first source/drain of the transistor M12 is configured to input the reference voltage level VGL, and the second source/drain of the transistor M12 is coupled to the node X. The gate of the transistor M13 is coupled to the second source/drain of the transistor M11, the first source/drain of the transistor M13 is configured to input the reference voltage level VGL2, and the second source/drain of the transistor M13 is coupled to the node Y.

Figure 4A:
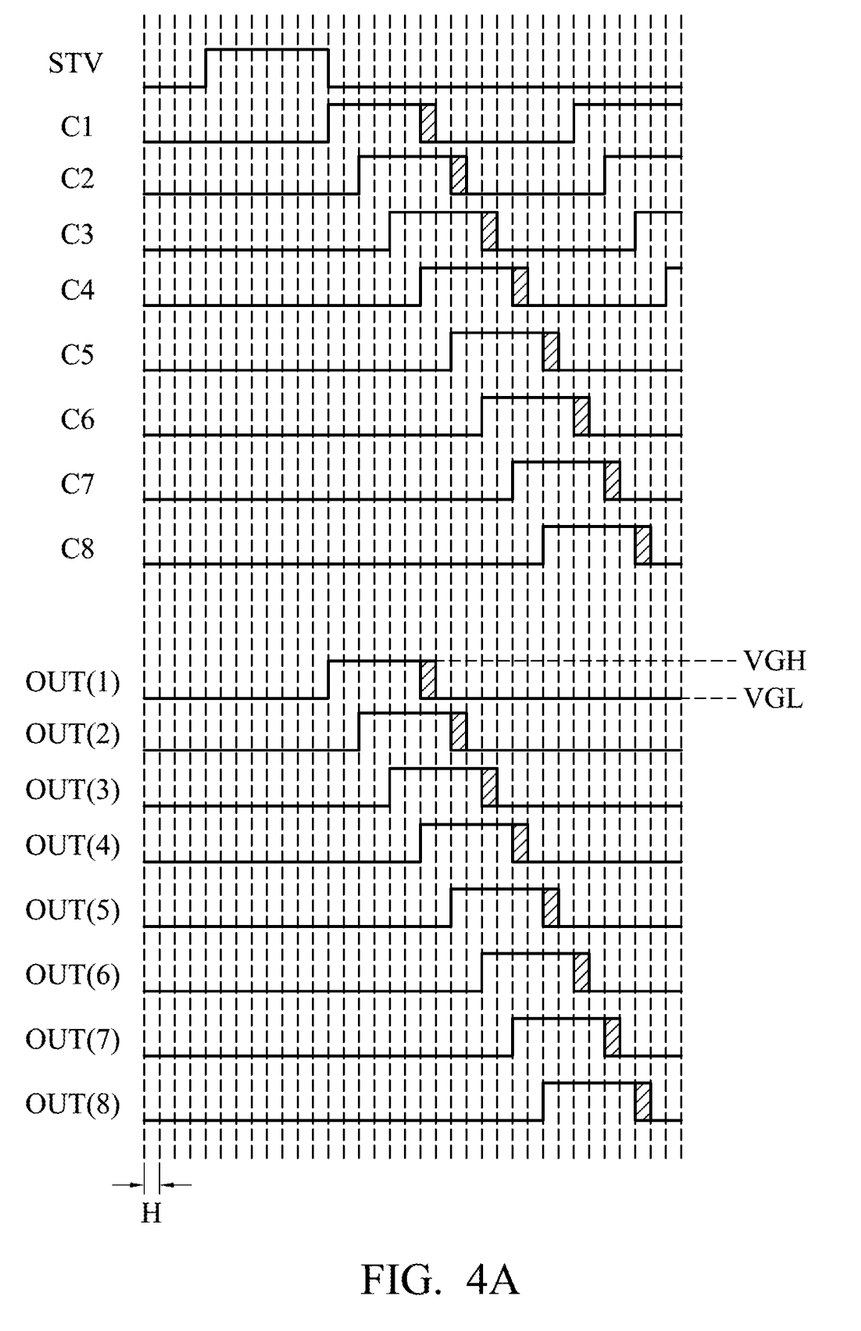
FIGS. 4A and 4B are time sequential diagrams of the gate driving circuit in FIG. 2.

Referring to FIG. 4A, FIG. 4A is a time sequential diagram of the gate driving circuit 200 of FIG. 2. As shown in FIG. 4A, after the starting signal STV falls to low voltage from high voltage, the clock signals C1-C8 sequentially rise to high voltage, such that the scan signals OUT(1)-OUT(8) correspondingly rise to a reference voltage level VGH, and then the clock signals C1-C8 sequentially fall to low voltage, such that the scan signals OUT(1)-OUT(8) correspondingly fall to the reference voltage level VGL. The clock signal C2 lags the clock signal C1 by ⅛ of a clock period, the clock signal C3 lags the clock signal C2 by ⅛ of the clock period, and the like. The scan signals OUT(9)-OUT(N) (not shown) sequentially rise to the reference voltage level VGH and fall to the reference voltage level VGL in a same manner in accordance with the above description for respectively driving the corresponding pixels in the display panel. In FIG. 4A, the shaded part of each of the scan signals OUT(1)-OUT(N) is a period for driving the display panel, and such period is defined as a data writing period H. The clock period of each of the clock signals C1-C8 is 16 data writing periods H, and for each of the clock signals C1-C8, the high level duration is shorter than the low level duration. In other words, the duty cycle of each of the clock signals C1-C8 is less than 50 percent. In some embodiments, the high level duration of each of the clock signals C1-C8 is half of the clock period of each of the clock signals C1-C8 subtracted by one data writing period H. As shown in FIG. 4A, the clock period of each of the clock signals C1-C8 is 16 data writing periods H (16H), and the high level duration and the low level duration of each of the clock signals C1-C8 are 7 data writing periods H (7H) and 9 data writing periods H (9H), respectively. For the scan signals OUT(i) and OUT(i+4) respectively outputted by the shift registers 210(i) and 210(i+4), there is a data writing period H between the high level durations of the scan signals OUT(i) and OUT(i+4), such that the scan signal OUT(i) has adequate time to fall to the reference voltage level VGL completely before the OUT(i+4) rises to the reference voltage level VGH. As such, mutual interference between the scan signals OUT(i) and OUT(i+4) can be improved. By the driving method illustrated in FIG. 4A, display issues such as spot mura defects, line mura defects or noise interference of the display apparatus can be solved, thereby improving the image display quality.

Figure 4B:
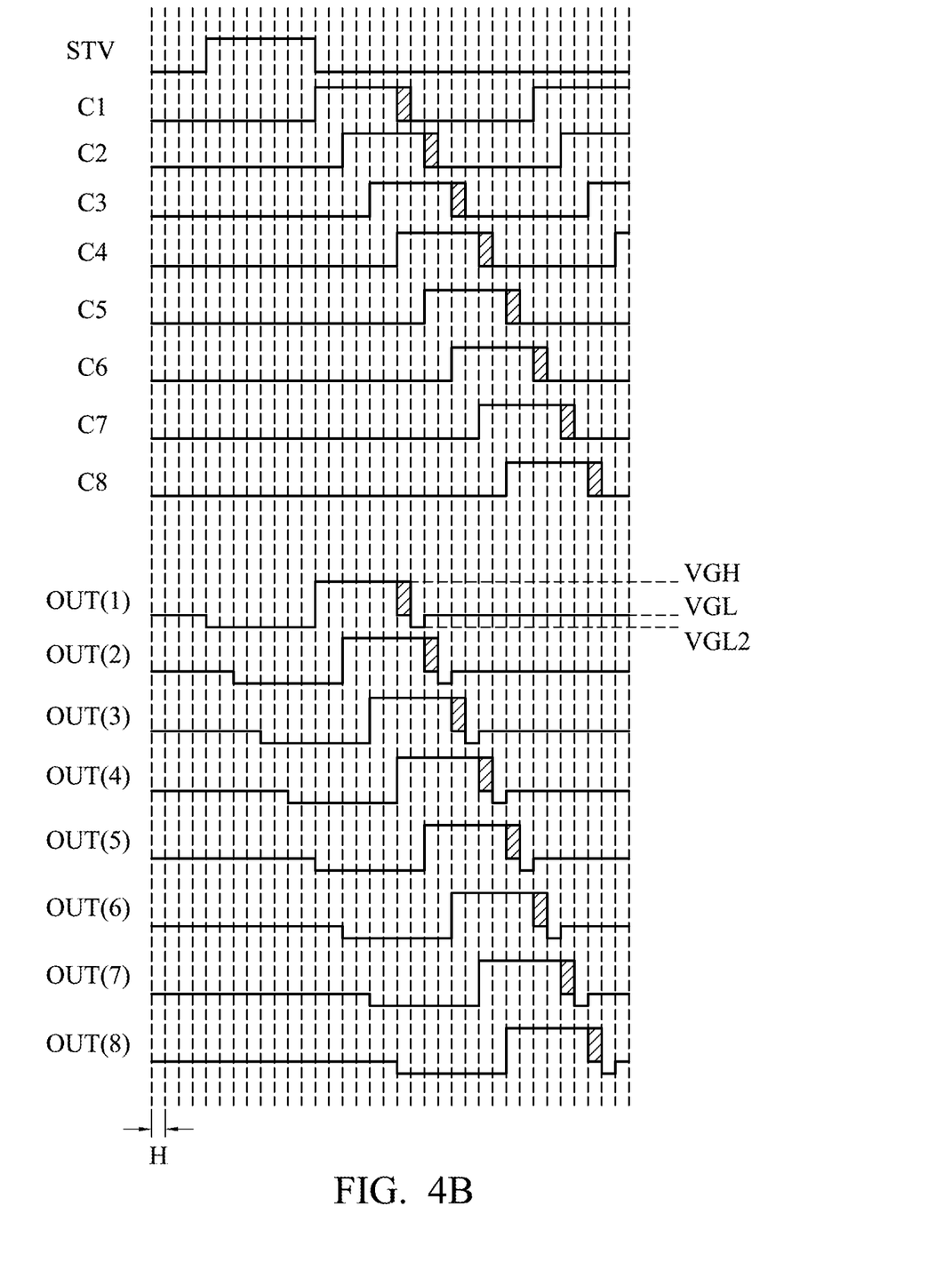

In some alternative embodiments, the reference voltage level VGL2 is configured to be lower than the reference voltage level VGL. For illustration, the difference between the reference voltage levels VGL and VGL2 is 3 volts, and in some embodiments, the reference voltage level VGL2 may be −10 volts or −9 volts, and the reference voltage level VGL may be −13 volts or −12 volts. As shown in FIG. 4B, the scan signals OUT(1)-OUT(8) sequentially fall to the reference voltage level VGL2 before rising to the reference voltage level VGH from the reference voltage level VGL. In addition, the scan signals OUT(1)-OUT(8) sequentially fall to the reference voltage level VGL2 which is lower than the reference voltage level VGL when the operation of driving the corresponding pixels in the display panel ends, and then sequentially rise to the reference voltage level VGL after a data writing period H elapses. Such method can also help reduce the elapsed time for each of the scan signals OUT (1)-OUT(N) to fall to the reference voltage level VGL completely from the reference voltage level VGH.

Figure 5:
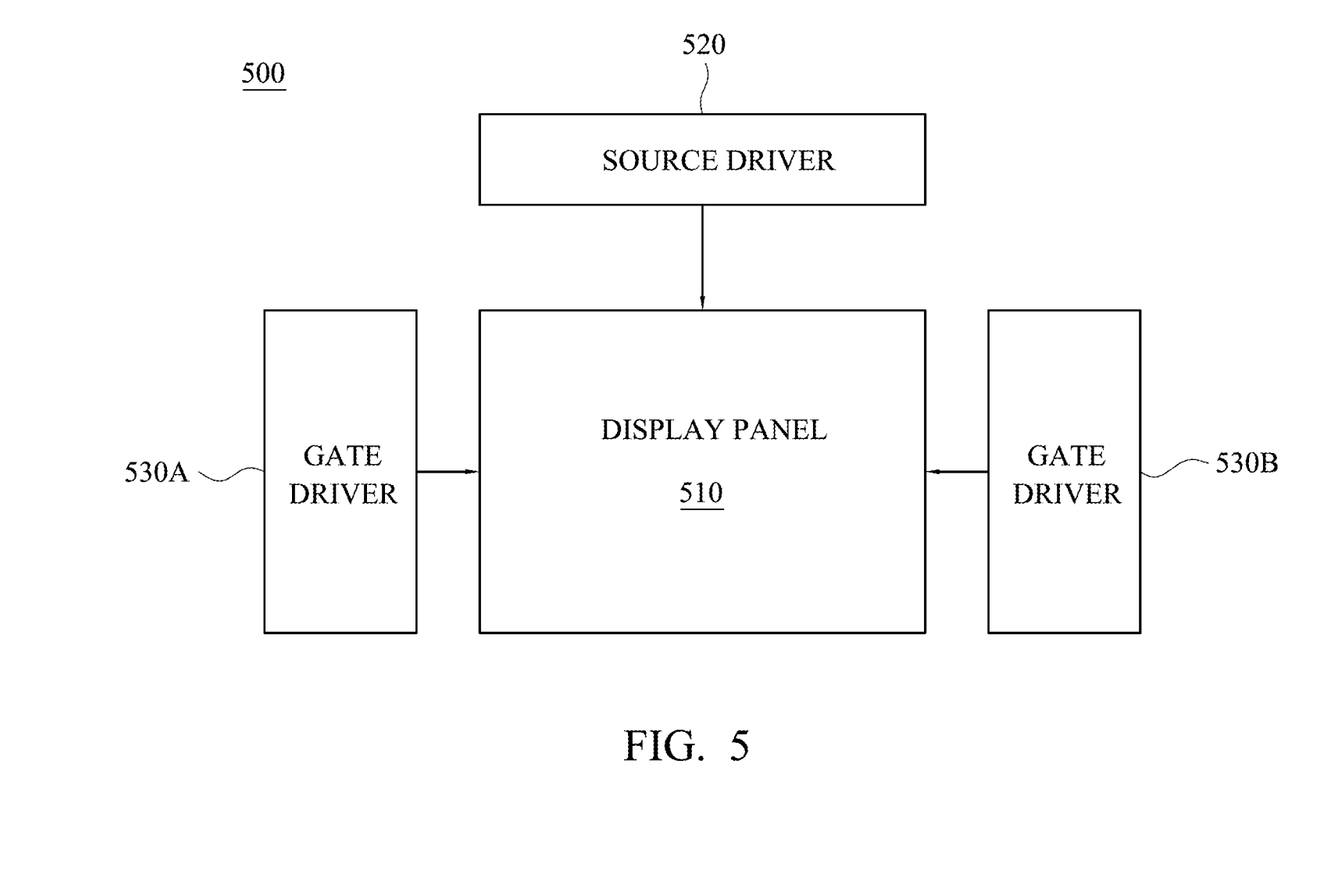
FIG. 5 is a schematic diagram of another display apparatus in accordance with some embodiments of the invention.

The configuration of the signals in the aforementioned embodiments is also applicable to a display apparatus which is driven simultaneously at left and right sides. Please refer to FIG. 5, which is a schematic diagram of a display apparatus 500 in accordance with some embodiments of the invention. The display apparatus 500 includes a display panel 510, a source driver 520 and gate drivers 530A and 530B. The display apparatus 500 is similar to the display apparatus 100 of FIG. 1. The display apparatuses 100 and 500 are different in that the display apparatus 500 includes two gate drivers 530A and 530B. As shown in FIG. 5, the gate drivers 530A and 530B are disposed at the left and right side of the display panel 510 respectively, and collectively transmit gate driving signals to the display panel 510. In another embodiment, the positions of the gate drivers 530A and 530B may be adjusted in accordance with various design requirements. The display panel 510 and the source driver 520 are substantially the same as the display panel 110 and the source driver 120 of FIG. 1 respectively, and thus the description thereof is not described again herein.

Figure 6:
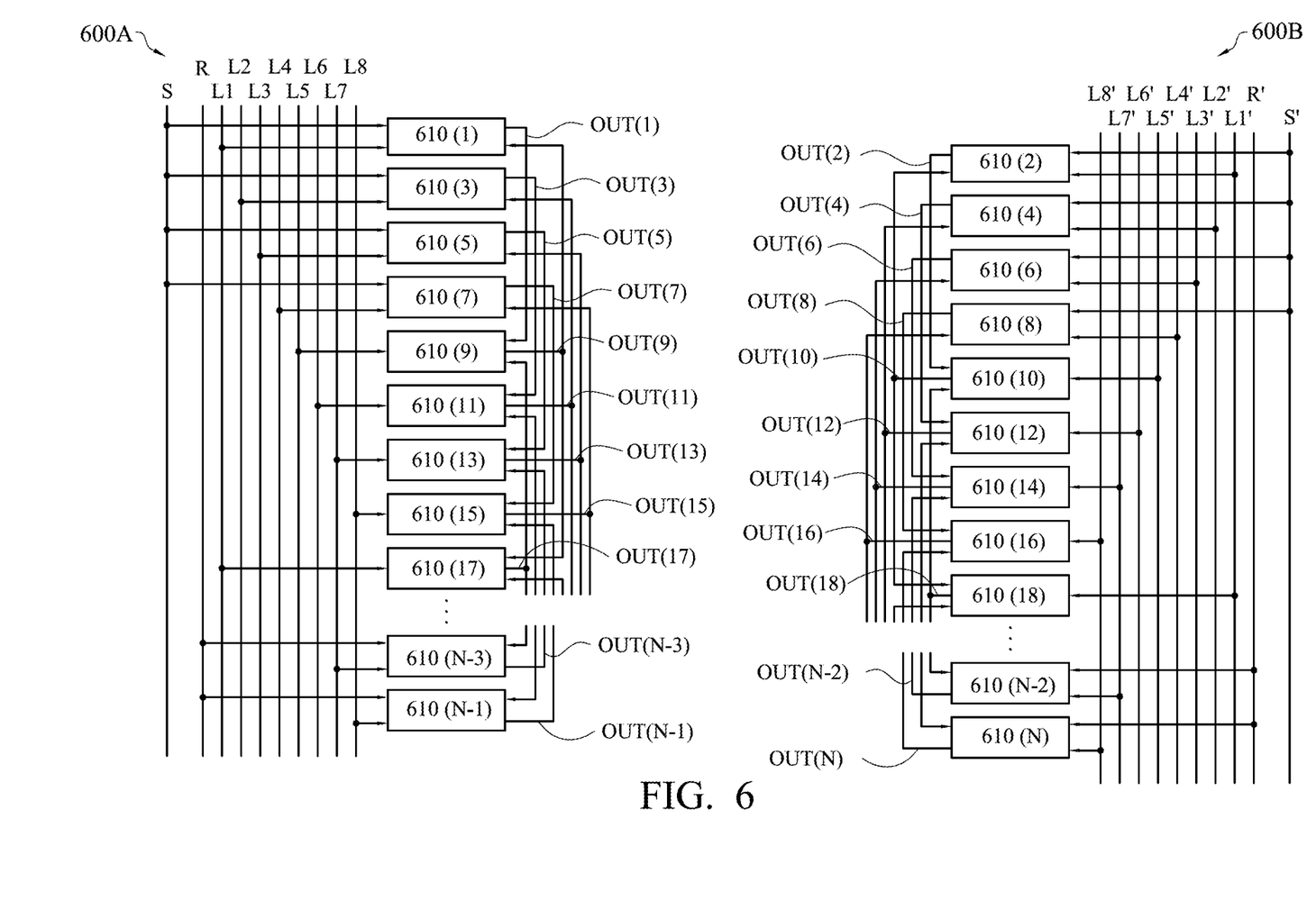
FIG. 6 is a schematic structural diagram of a gate driving circuit in accordance with some embodiments of the invention.

Please refer to FIG. 6, which is a schematic structural diagram of gate driving circuits 600A and 600B in accordance with some embodiment of the invention. The gate driving circuits 600A and 600B are applicable to the display apparatus 500 of FIG. 5 or another similar display apparatus. In the following, the display apparatus 500 of FIG. 5 is exemplified for description. The gate driving circuits 600A and 600B are respectively parts of the gate drivers 530A and 530B. The gate driving circuit 600A includes clock signal lines L1-L8, a starting signal line S, an ending signal line R and odd-numbered stage shift registers 610(1), 610(3), . . . , 610(N−1) of N stage shift registers 610(1)-610(N), and the gate driving circuit 600B includes clock signal lines L1'-L8', a starting signal line S', an ending signal line R' and even-numbered stage shift registers 610(2), 610(4), . . . , 610(N) of the N stage shift registers 610(1)-610(N), where N is an integer greater than or equal to 17. In some embodiments, N is a multiple of 16. The clock signal lines L1-L8 and L1'-L8' are configure to respectively provide clock signals C1-C8 and C1'-C8' to the corresponding shift registers 610(1)-610(N). In addition, the starting signal line S provides a starting signal STV to the $1^{st}$, $3^{rd}$, $5^{th}$ and $7^{th}$ stage shift registers 610(1), 610(3), 610(5) and 610(7), the starting signal line S' provides a starting signal STV' to the $2^{nd}$, $4^{th}$, $6^{th}$ and $8^{th}$ stage shift register 610(2), 610(4), 610(6) and 610(8), the ending signal line R provides an ending signal RSTV to the $(N-7)^{th}$, $(N-5)^{th}$, $(N-3)^{th}$ and $(N-1)^{th}$ stage shift registers 610(N−7), 610(N−5), 610(N−3) and 610(N−1), and the ending signal line R' provides an ending signal RSTV' to the $(N-6)^{th}$, $(N-4)^{th}$, $(N-2)^{th}$ and $N^{th}$ stage shift registers 610(N−6), 610(N−4), 610(N−2) and 610(N). The shift registers 610(1)-610(N) respectively generate scan signals OUT(1)-OUT(N). The scan signals OUT(1)-OUT(8) are respectively inputted to the $9^{th}$ to $16^{th}$ stage shift registers 610(9)-610(16), the scan signals OUT(N−7)-OUT(N) are respectively inputted to the $(N-15)^{th}$ to $(N-8)^{th}$ stage shift registers 610(N−15)-610(N−8), and each of the scan signals OUT(9)-OUT(N−8) is inputted to the shift registers previous four stage shift register thereto and next four stage shift register thereto. For illustration, the scan signal OUT(9) is inputted to the $1^{st}$ stage shift register 610(1) and the $17^{th}$ stage shift register 610(17).

Figure 7:
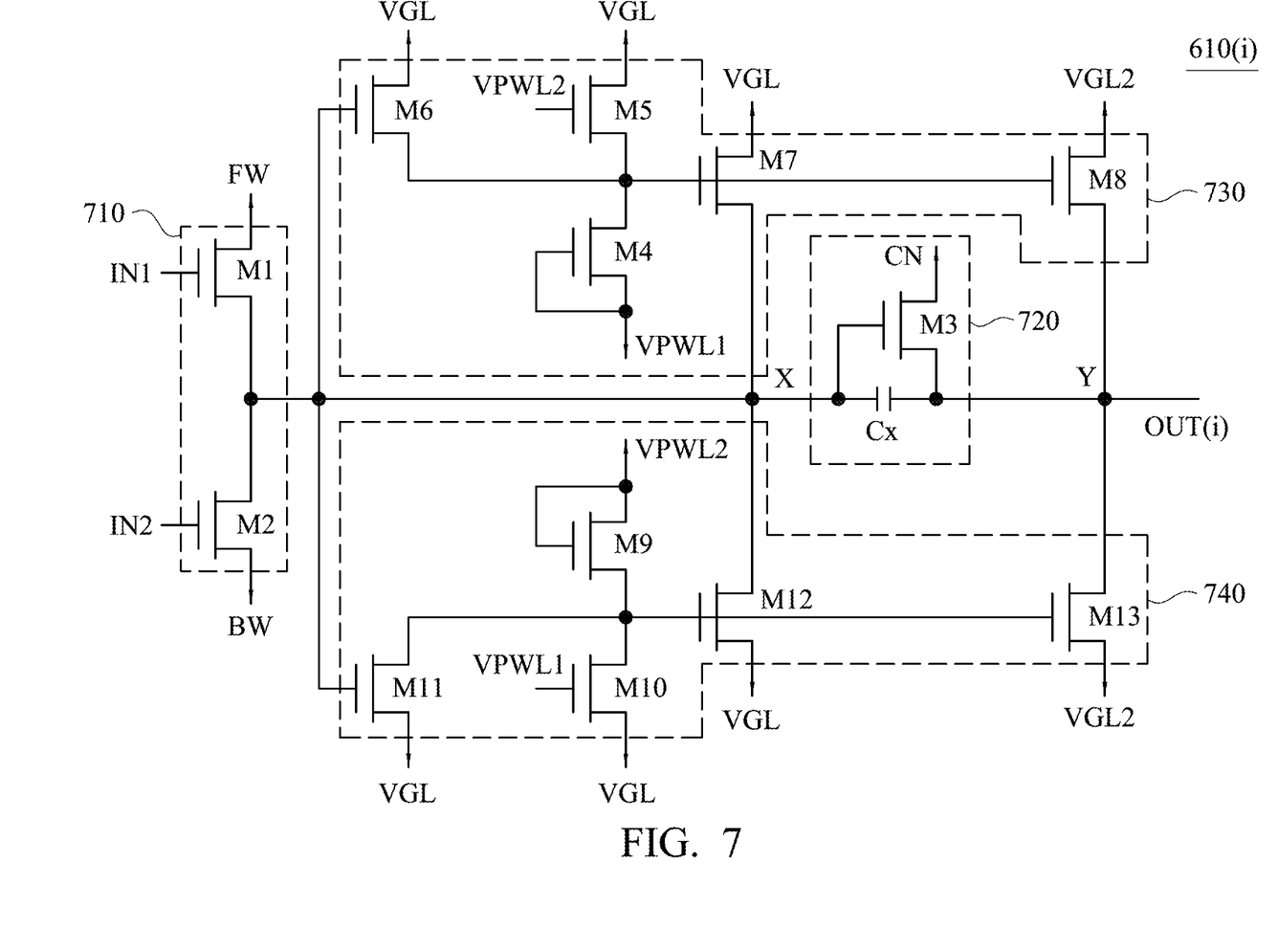
FIG. 7 is an equivalent circuit diagram of a shift register of the gate driving circuit in FIG. 6.

FIG. 7 is an equivalent circuit diagram of the $i^{th}$ stage shift register 610($i$) of the gate driving circuits 600A and 600B in FIG. 6, where i is an integer from 1 to N. The $i^{th}$ stage shift register 610($i$) includes a pre-charge unit 710, a pull-up unit 720, a first pull-down unit 730 and a second pull-down unit 740.

The pre-charge unit 710 is configured to receive input signals IN1 and IN2 and to output a pre-charge signal via a node X based on the input signals IN1 and IN2. The pre-charge unit 710 includes transistors M1 and M2. In this embodiment, the gate driving circuits 600A and 600B perform two-way scanning, and in each of the shift registers 610(1)-610(N), the gate of the transistor M1 is configured to receive the input signal IN1, the first source/drain of the transistor M1 is configured to receive a forward input signal FW, and the second source/drain of the transistor M1 is configured to output the pre-charge signal. The gate of the transistor M2 is configured to receive the input signal IN2, the first source/drain of the transistor M2 is configured to receive a backward input signal BW, and the second source/drain of the transistor M2 is coupled to the second source/drain of the transistor M1.

If the shift register 610($i$) is one of the $1^{st}$-$8^{th}$ stage shift register 610(1)-610(8) (i.e. i is an integer from 1 to 8), the input signal IN1 is the starting signal STV or the starting signal STV', and the input signal IN2 is the scan signal OUT(i+8) outputted by the $(i+8)^{th}$ stage shift register 610(i+8). If the shift register 610($i$) is one of the $9^{th}$-$(N-8)^{th}$ stage shift register 610(9)-610(N−8) (i.e. i is an integer from 9 to (N−8)), the input signal IN1 is the scan signal OUT(i−8) outputted by the $(i-8)^{th}$ stage shift register 610(i−8), and the input signal IN2 is the scan signal OUT(i+8) outputted by the $(i+8)^{th}$ stage shift register 610(i+8). If the shift register 610($i$) is one of the $(N-7)^{th}$-$N^{th}$ stage shift register 610(N−7)-610(N) (i.e. i is an integer from (N−7) to N), the input signal IN1 is the scan signal OUT(i−8) outputted by the $(i-8)^{th}$ stage shift register 610(i−8), and the input signal IN2 is the ending signal RSTV or the ending signal RSTV'.

The pull-up unit 720, the first pull-down unit 730 and the second pull-down unit 740 are similar to the pull-up unit 320, the first pull-down unit 330 the second pull-down unit 340 of FIG. 3, respectively, and thus the description of the pull-up unit 720, the first pull-down unit 730 and the second pull-down unit 740 may be referred to the preceding paragraphs and is not described again herein.

Figure 8A:
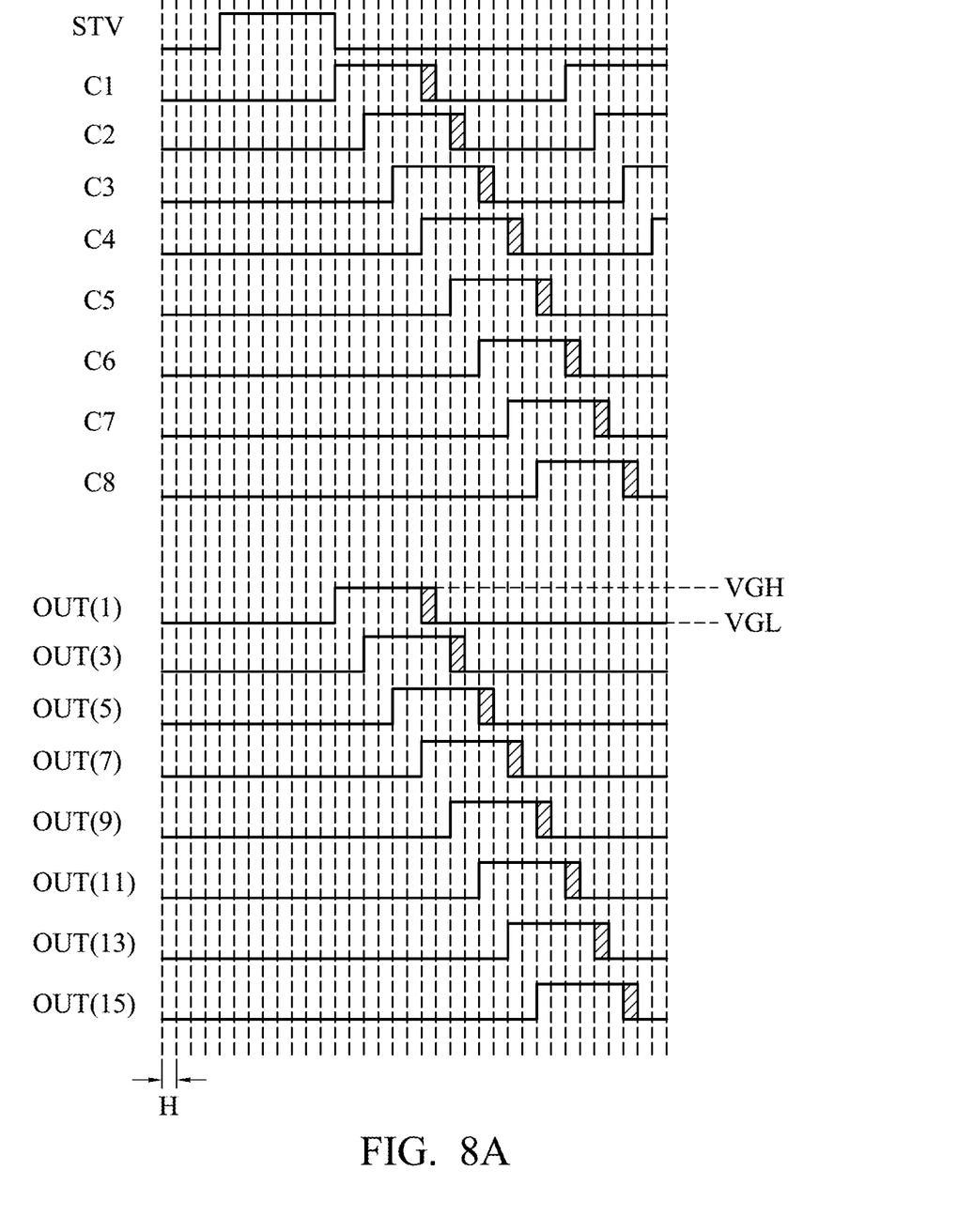
FIGS. 8A and 8B are time sequential diagrams of the gate driving circuit in FIG. 6.

Referring to FIG. 8A, FIG. 8A is a time sequential diagram of the gate driving circuit 600 of FIG. 6. As shown in FIG. 8A, after the starting signal STV falls to low voltage from high voltage, the clock signals C1-C8 sequentially rise to high voltage, such that the scan signals OUT(1), OUT(3), OUT(5), OUT(7), OUT(9), OUT(11), OUT(13) and OUT(15) correspondingly rise a reference voltage level VGH, and then the clock signals C1-C8 sequentially fall to low voltage, such that the scan signals OUT(1), OUT(3), OUT(5), OUT(7), OUT(9), OUT(11), OUT(13) and OUT(15) correspondingly fall to the reference voltage level VGL. The clock signal C2 lags the clock signal C1 by ⅛ of the clock period, the clock signal C3 lags the clock signal C2 by ⅛ of the clock period, and the like. The odd-stage scan signals OUT(17), OUT(19), . . . OUT(N−1) (not shown) sequentially rise to the reference voltage level VGH and fall to the reference voltage level VGL in a same manner in accordance with the above description for respectively driving the corresponding pixels in the display panel. In FIG. 8A, the shaded part of each of the scan signals OUT(1)-OUT(N) is a period for driving the display panel, and such period is defined as a data writing period H. The clock period of each of the clock signals C1-C8 is 16 data writing periods H, and for each of the clock signals C1-C8, the high level duration is shorter than the low level duration. In other words, the duty cycle of each of the clock signals C1-C8 is less than 50 percent. In some embodiments, the high level duration of each of the clock signals C1-C8 is half of the clock period of the clock signals C1-C8 subtracted by one data writing period H. As shown in FIG. 8A, the clock period of each of the clock signals C1-C8 is 16 data writing periods H (16H), and the high level duration and the low level duration of each of the clock signals C1-C8 are 7 data writing periods H (7H) and 9 data writing periods H (9H), respectively. For the scan signals OUT(i) and OUT(i+8) respectively outputted by the shift registers 610(i) and 610(i+8), there is a data writing period H between the high level durations of the scan signals OUT(i) and OUT(i+8), such that the scan signal OUT(i) has adequate time to fall to the reference voltage level VGL completely before the OUT(i+8) rises to the reference voltage level VGH. As such, mutual interference between the scan signals OUT(i) and OUT(i+8) can be improved. By the driving method illustrated in FIG. 8A, display issues such as spot mura defects, line mura defects or noise interference of the display apparatus can be solved, thereby improving the image display quality.

It should be noted that, although a time sequential diagram of the gate driving circuit 600B is not illustrated in FIG. 8A, the driving method thereof is approximately the same as that of the gate driving circuit 600A, and thus the driving description about the gate driving circuit 600B is not described again herein.

Figure 8B:
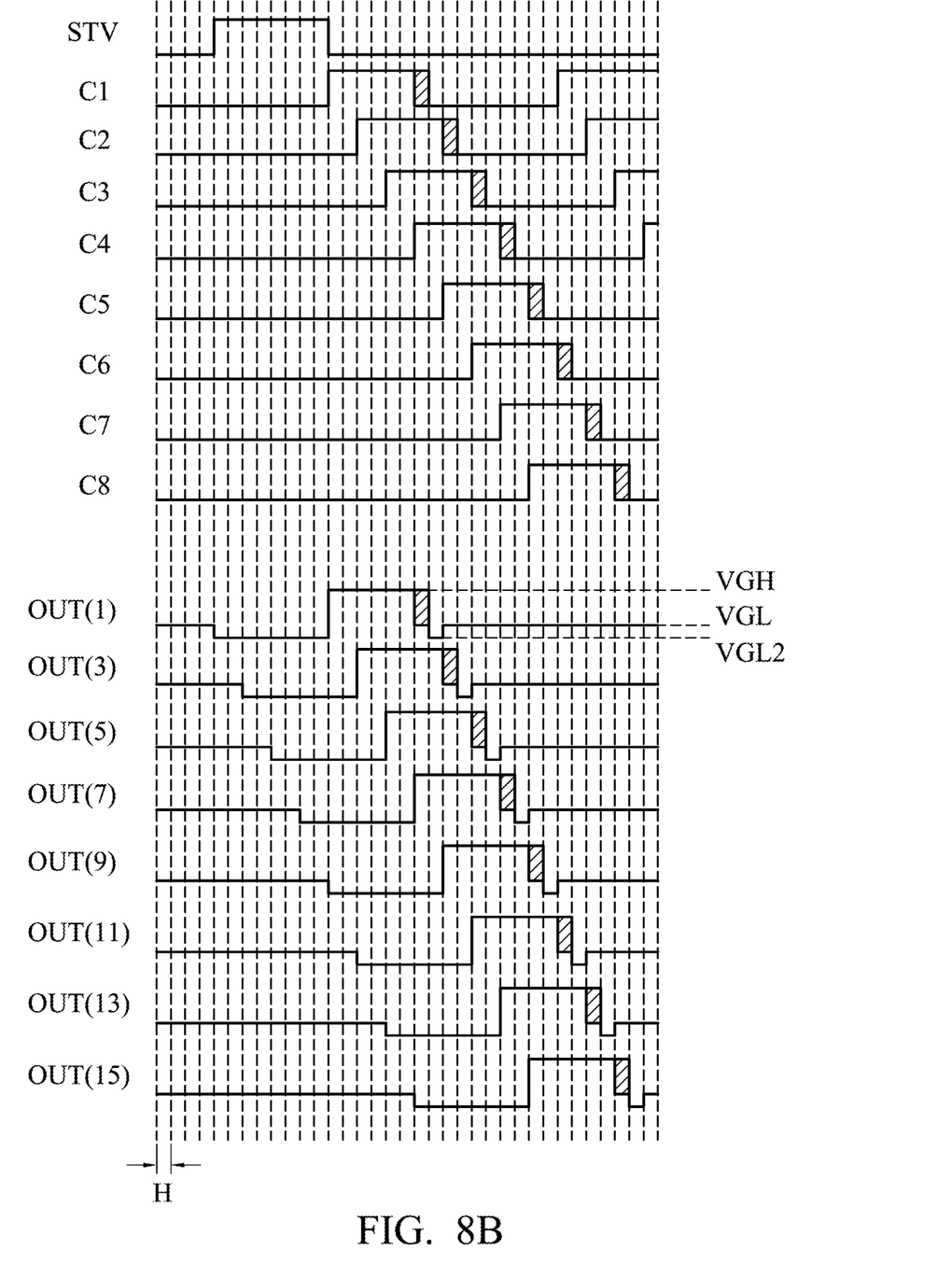

In some alternative embodiments, the reference voltage level VGL2 is configured to be lower than the reference voltage level VGL. For illustration, the difference between the reference voltage levels VGL and VGL2 is 3 volts, and in some embodiments, the reference voltage level VGL2 may be −10 volts or −9 volts, and the reference voltage level VGL may be −13 volts or −12 volts. As shown in FIG. 8B, the scan signals OUT(1), OUT(3), OUT(5), OUT(7), OUT(9), OUT(11), OUT(13) and OUT(15) sequentially fall to the reference voltage level VGL2 before rising to the reference voltage level VGH from the reference voltage level VGL. In addition, the scan signals OUT(1), OUT(3), OUT(5), OUT(7), OUT(9), OUT(11), OUT(13) and OUT(15) sequentially fall to the reference voltage level VGL2 which is lower than the reference voltage level VGL when the driving to the corresponding pixels in the display panel ends, and then sequentially rise to the reference voltage level VGL after a data writing period H elapses. Such method can also help reduce the elapsed time for each of the scan signals OUT(1)-OUT(N) to fall to the reference voltage level VGL completely from the reference voltage level VGH.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A shift register, comprising:
    a pre-charge unit configured to receive a first input signal and a second input signal and to output a pre-charge signal via a first node based on the first input signal and the second input signal, wherein the pre-charge unit comprises:
        a first transistor, wherein a gate of the first transistor is configured to receive a starting signal, a first source/drain of the first transistor is configured to receive a forward input signal, and a second source/drain of the first transistor is configured to output the pre-charge signal; and
        a second transistor, wherein a gate and a first source/drain of the second transistor are configured to receive a scan signal outputted by a next four stage shift register, and a second source/drain of the second transistor is coupled to the second source/drain of the first transistor;
    a pull-up unit coupled to the pre-charge unit, the pull-up unit configured to receive the pre-charge signal and a clock signal and to output a scan signal via a second node based on the pre-charge signal and the clock signal;
    a first pull-down unit coupled to the pre-charge unit and the pull-up unit, the first pull-down unit configured to receive the pre-charge signal, a first pull-down control signal and a second pull-down control signal and to control whether to pull down the scan signal to a first reference voltage level based on the pre-charge signal, the first pull-down control signal and the second pull-down control signal; and
    a second pull-down unit coupled to the pre-charge unit and the pull-up unit, the second pull-down unit configured to receive the pre-charge signal, the first pull-down control signal and the second pull-down control signal and to control whether to keep the scan signal at the first reference voltage level based on the pre-charge signal, the first pull-down control signal and the second pull-down control signal;
    wherein a duty cycle of the clock signal is less than 50 percent.

2. The shift register of claim 1, wherein a high level duration of the clock signal is half of a clock period of the clock signal subtracted by a data writing period.

3. The shift register of claim 1, wherein the pull-up unit comprises:
    a third transistor, wherein a gate of the third transistor is configured to receive the pre-charge signal, a first source/drain of the third transistor is configured to receive the clock signal, and a second source/drain of the third transistor is configured to output the scan signal; and a capacitor, wherein a first terminal of the capacitor is coupled to the gate of the third transistor, and a second terminal of the capacitor is coupled to the second source/drain of the third transistor.

4. The shift register of claim 1, wherein the first pull-down unit comprises:

a fourth transistor, wherein a gate and a first source/drain of the fourth transistor are configured to input the first pull-down control signal;

a fifth transistor, wherein a gate of the fifth transistor is configured to input the second pull-down control signal, a first source/drain of the fifth transistor is configured to input the first reference voltage level, and a second source/drain of the fifth transistor is coupled to the second source/drain of the fourth transistor;

a sixth transistor, wherein a gate of the sixth transistor is coupled to the first node, a first source/drain of the sixth transistor is configured to input the first reference voltage level, and a second source/drain of the sixth transistor is coupled to the second source/drain of the fourth transistor;

a seventh transistor, wherein a gate of the seventh transistor is coupled to the second source/drain of the sixth transistor, a first source/drain of the seventh transistor is configured to input the first reference voltage level, and a second source/drain of the seventh transistor is coupled to the first node; and an eighth transistor, wherein a gate of the eighth transistor is coupled to the second source/drain of the sixth transistor, a first source/drain of the eighth transistor is configured to input a second reference voltage level, and a second source/drain of the eighth transistor is coupled to the second node.

5. The shift register of claim 4, wherein the second reference voltage level is substantially lower than the first reference voltage level.

6. The shift register of claim 5, wherein a difference between the second reference voltage level and the first reference voltage level is substantially 3 volts.

7. The shift register of claim 1, wherein the second pull-down unit comprises:

a ninth transistor, wherein a gate and a first source/drain of the ninth transistor are configured to input the second pull-down control signal;

a tenth transistor, wherein a gate of the tenth transistor is configured to input the first pull-down control signal, a first source/drain of the tenth transistor is configured to input the first reference voltage level, and a second source/drain of the tenth transistor is coupled to the second source/drain of the ninth transistor;

an eleventh transistor, wherein a gate of the eleventh transistor is coupled to the first node, a first source/drain of the eleventh transistor is configured to input the first reference voltage level, and a second source/drain of the eleventh transistor is coupled to the second source/drain of the ninth transistor;

a twelfth transistor, wherein a gate of the twelfth transistor is coupled to the second source/drain of the eleventh transistor, a first source/drain of the twelfth transistor is configured to input the first reference voltage level, and a second source/drain of the twelfth transistor is coupled to the first node; and a thirteenth transistor, wherein a gate of the thirteenth transistor is coupled to the second source/drain of the eleventh transistor, a first source/drain of the thirteenth transistor is configured to input a second reference voltage level, and a second source/drain of the thirteenth transistor is coupled to the second node.

8. The shift register of claim 7, wherein the second reference voltage level is substantially lower than the first reference voltage level.

9. The shift register of claim 8, wherein a difference between the second reference voltage level and the first reference voltage level is substantially 3 volts.

10. A display apparatus, comprising:

a display panel; and a gate driver configured to drive the display apparatus and having $1^{st}$-$N^{th}$ stage shift registers, wherein the $i^{th}$ stage shift register of the $1^{st}$-$N^{th}$ stage shift registers comprises:

a pre-charge unit configured to receive a first input signal and a second input signal and output a pre-charge signal via a first node based on the first input signal and the second input signal, wherein the pre-charge unit of the $i^{th}$ stage shift register comprises:

a first transistor, wherein a gate of the first transistor is configured to receive the first input signal, a first source/drain of the first transistor is configured to receive a forward input signal, and a second source/drain of the first transistor is configured to output the pre-charge signal; and a second transistor, wherein a gate and a first source/drain of the second transistor are configured to receive the second input signal, and a second source/drain of the second transistor is coupled to the second source/drain of the first transistor, wherein:

when i is from 1 to 4, the first input signal is a starting signal, and the second input signal is an $(i+4)^{th}$ stage scan signal outputted by the $(i+4)^{th}$ stage shift register of the $1^{st}$-$N^{th}$ stage shift registers;

when i is from (N−3) to N, the first input signal is an $(i-4)^{th}$ stage scan signal outputted by the $(i-4)^{th}$ stage shift register of the $1^{st}$-$N^{th}$ stage shift registers, and the second input signal is an ending signal;

when i is from 5 to (N−4), the first input signal is an $(i-4)^{th}$ stage scan signal outputted by the $(i-4)^{th}$ stage shift register of the $1^{st}$-$N^{th}$ stage shift registers, and the second input signal is an $(i+4)^{th}$ stage scan signal outputted by the $(i+4)^{th}$ stage shift register of the $1^{st}$-$N^{th}$ stage shift registers;

a pull-up unit that is coupled to the pre-charge unit, the pull-up unit configured to receive the pre-charge signal and a clock signal and output an $i^{th}$ stage scan signal via a second node based on the pre-charge signal and the clock signal;

a first pull-down unit coupled to the pre-charge unit and the pull-up unit, the first pull-down unit configured to receive the pre-charge signal, a first pull-down control signal and a second pull-down control signal and control whether to pull down the $i^{th}$ stage scan signal to a first reference voltage level based on the pre-charge signal, the first pull-down control signal and the second pull-down control signal; and a second pull-down unit coupled to the pre-charge unit and the pull-up unit, the second pull-down unit configured to receive the pre-charge signal, the first pull-down control signal and the second pull-down control signal and control whether to keep the $i^{th}$ stage scan signal at the first reference voltage level based on the pre-charge signal, the first pull-down control signal and the second pull-down control signal;

wherein a duty cycle of the clock signal is less than 50 percent.

11. The display apparatus of claim 10, wherein a high level duration of the clock signal is half of a clock period of the clock signal subtracted by a data writing period.

12. The display apparatus of claim 10, wherein the pull-up unit of the $i^{th}$ stage shift register comprises:
a third transistor, wherein a gate of the third transistor is configured to receive the pre-charge signal, a first source/drain of the third transistor is configured to receive the clock signal, and a second source/drain of the third transistor is configured to output the $i^{th}$ stage scan signal; and
a capacitor, wherein a first terminal of the capacitor is coupled to the gate of the third transistor, and a second terminal of the capacitor is coupled to the second source/drain of the third transistor.

13. The display apparatus of claim 10, wherein the first pull-down unit of the $i^{th}$ stage shift register comprises:
a fourth transistor, wherein a gate and a first source/drain of the fourth transistor are configured to input the first pull-down control signal;
a fifth transistor, wherein a gate of the fifth transistor is configured to input the second pull-down control signal, a first source/drain of the fifth transistor is configured to input the first reference voltage level, and a second source/drain of the fifth transistor is coupled to the second source/drain of the fourth transistor;
a sixth transistor, wherein a gate of the sixth transistor is coupled to the first node, a first source/drain of the sixth transistor is configured to input the first reference voltage level, and a second source/drain of the sixth transistor is coupled to the second source/drain of the fourth transistor;
a seventh transistor, wherein a gate of the seventh transistor is coupled to the second source/drain of the sixth transistor, a first source/drain of the seventh transistor is configured to input the first reference voltage level, and a second source/drain of the seventh transistor is coupled to the first node; and
an eighth transistor, wherein a gate of the eighth transistor is coupled to the second source/drain of the sixth transistor, a first source/drain of the eighth transistor is configured to input a second reference voltage level, and a second source/drain of the eighth transistor is coupled to the second node;
wherein the second reference voltage level is substantially lower than the first reference voltage level.

14. The display apparatus of claim 13, wherein a difference between the second reference voltage level and the first reference voltage level is substantially 3 volts.

15. The display apparatus of claim 10, wherein the second pull-down unit of the $i^{th}$ stage shift register comprises:
a ninth transistor, wherein a gate and a first source/drain of the ninth transistor are configured to input the second pull-down control signal;
a tenth transistor, wherein a gate of the tenth transistor is configured to input the first pull-down control signal, a first source/drain of the tenth transistor is configured to input the first reference voltage level, and a second source/drain of the tenth transistor is coupled to the second source/drain of the ninth transistor;
an eleventh transistor, wherein a gate of the eleventh transistor is coupled to the first node, a first source/drain of the eleventh transistor is configured to input the first reference voltage level, and a second source/drain of the eleventh transistor is coupled to the second source/drain of the ninth transistor;
a twelfth transistor, wherein a gate of the twelfth transistor is coupled to the second source/drain of the eleventh transistor, a first source/drain of the twelfth transistor is configured to input the first reference voltage level, and a second source/drain of the twelfth transistor is coupled to the first node; and
a thirteenth transistor, wherein a gate of the thirteenth transistor is coupled to the second source/drain of the eleventh transistor, a first source/drain of the thirteenth transistor is configured to input a second reference voltage level, and a second source/drain of the thirteenth transistor is coupled to the second node;
wherein the second reference voltage level is substantially lower than the first reference voltage level.

16. The display apparatus of claim 15, wherein a difference between the second reference voltage level and the first reference voltage level is substantially 3 volts.

* * * * *